US007275230B2

(12) United States Patent
Gentry et al.

(10) Patent No.: US 7,275,230 B2
(45) Date of Patent: Sep. 25, 2007

(54) METHODS TO GATHER AND DISPLAY PIN CONGESTION STATISTICS USING GRAPHICAL USER INTERFACE

(75) Inventors: Jason Todd Gentry, Wellington, CO (US); Jack Douglas Benzel, Loveland, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 335 days.

(21) Appl. No.: 10/866,457

(22) Filed: Jun. 11, 2004

(65) Prior Publication Data

US 2005/0278665 A1 Dec. 15, 2005

(51) Int. Cl.
*G06F 17/50* (2006.01)

(52) U.S. Cl. .............................. 716/13; 716/14; 716/15

(58) Field of Classification Search ............... 716/8–15
See application file for complete search history.

(56) References Cited

U.S. PATENT DOCUMENTS

| 5,309,372 A * | 5/1994 | Marui et al. .................. 716/12 |
| 7,065,730 B2 * | 6/2006 | Alpert et al. .................. 716/13 |
| 2001/0049814 A1 * | 12/2001 | Matsumoto et al. ........... 716/10 |
| 2005/0138595 A1 * | 6/2005 | Khakzadi et al. ............. 716/18 |

* cited by examiner

*Primary Examiner*—Jack Chiang
*Assistant Examiner*—Binh Tat

(57) ABSTRACT

The present invention is a method for collecting, analyzing, and displaying statistics regarding block pin placement prior to routing of an integrated circuit. The statistics are graphically displayed in a graphical user interface (GUI). The GUI graphically displays indications of where block pin congestion problems lie, which allows an integrated circuit designer to quickly pinpoint and correct pin placement in areas of pin congestion to alleviate congestion in these areas prior to routing.

28 Claims, 6 Drawing Sheets

METHODS TO GATHER AND DISPLAY PIN CONGESTION STATISTICS USING GRAPHICAL USER INTERFACE

BACKGROUND OF THE INVENTION

The present invention relates generally to integrated circuit routing, and more particularly to a method and system for gathering and displaying pin congestion statistics using a graphical user interface.

Integrated circuits consist of a large number of electronic components that are fabricated by layering several different materials on a silicon base or wafer. The physical design of an integrated circuit transforms a circuit description into a geometric description which is known as a layout. A layout consists of a set of planar geometric shapes in several layers.

The objective of physical design is to determine an optimal arrangement of devices in a plane or in a three dimensional space, and an efficient interconnection or routing scheme between the devices to obtain the desired functionality. Since space on a wafer is very expensive real estate, algorithms must use the space very efficiently to lower costs and improve yield.

The input to the physical design problem is a circuit diagram, and the output is the layout of the circuit. The physical design is accomplished in several stages including partitioning, floor-planning, placement, and routing.

A chip may contain several million transistors. Layout of the entire circuit cannot typically be handled by currently available floor-planning tools due to the limitation of memory space as well as the computational power available. Therefore, the circuit is normally partitioned by grouping the components into functional blocks such as subcircuits and modules. The actual partitioning process considers many factors such as the size of the blocks, number of blocks and number of interconnections between the blocks.

The output of partitioning is a set of blocks, along with the interconnections required within and between blocks. The set of interconnections required is referred to as a netlist. In large circuits, the partitioning process is often hierarchical, although non-hierarchical (e.g. flat) processes can be used, and at the topmost level a circuit typically has between 5 to 25 blocks. However, greater numbers of blocks are possible and contemplated. Each block is then partitioned recursively into smaller blocks.

The floor-planning step is concerned with selecting good layout alternatives for each block of the entire chip, as well as between blocks and to the edges. Floor-planning is a critical step as it sets up the ground work for a good layout. However it is computationally quite hard. Very often the task of floorplan layout is done by a design engineer using a CAD tool. This is necessary as the major components of an IC are often intended for specific locations on the chip.

During placement, the blocks and locations of the block terminals, referred to hereinafter as block "pins", within the blocks are exactly positioned on the chip. The goal of placement is to find a minimum area arrangement for the blocks that allows completion of interconnections defined by the netlist. Placement is typically done in two phases. In the first phase, an initial placement is created. In the second phase, the initial placement is evaluated and iterative improvements are made until the layout has minimum area and conforms to design specifications.

During the physical design of an integrated circuit, unforeseen routing congestion issues can arise when the floor-planning process does not address the full details involved in fully implementing the physical realization of the blocks and the interconnects between them. Often times, the design database is somewhat simplified or not yet complete in the floor-planning application. An example of one such simplification is the existence of pins defined on the edges of blocks which do not have associated net connectivity within or outside of the block. When determining and analyzing the placement of such pins, the floor-planning application and the integrated circuit designer have no insight into the additional routing congestion which will be realized when the additional connectivity is added at a later time. This can cause routing congestion problems both inside of the block and at the top-level.

In the past, the quality of block and block pin placement could not be determined until the routing phase had been completed. Due to the complexity of the routing problem, it is well known that a particular block placement may lead to an unroutable design. For example, routing may not be possible in the space provided. However, given an unroutable placement design, it is often the case that the source of the unroutablility problem lies in routing congestion around the block pins. Accordingly, often an otherwise unroutable block placement design may be made routable by changing the placement of the block pins within the blocks.

However, because there does not currently exist any automated solution of collecting, determining, and displaying pin placement congestion statistics, integrated circuit designers must wait for completion of routing to determine the routability/unroutability and quality of a given integrated circuit floorplan. Because the analysis of the congestion is done post-route, needless wasted time is often spent trying to route to pins that are arranged such that routing to them is virtually impossible or at least requires a lot of manual steps to fix.

It would therefore be desirable to have a method for collecting and analyzing pin congestion statistics to allow replacement of block pins prior to performing inter-block routing in integrated circuits.

SUMMARY OF THE INVENTION

The present invention is a method for collecting, analyzing, and displaying statistics regarding block pin placement prior to routing. The statistics are graphically displayed in a graphical user interface (GUI). The GUI graphically displays indications of where block pin congestion problems lie, which allows an integrated circuit designer to quickly pinpoint and correct pin placement in areas of pin congestion to alleviate congestion in these areas prior to submission of the layout to the router.

In a preferred embodiment, the pin congestion statistics collection and analysis algorithm sorts the pins of a block that meet selected criteria in a clockwise (or counter-clockwise) direction to generate a circular pin list. The pin congestion statistics collection and analysis algorithm then iterates over the pins in the pin list to gather statistics based on user input or default options. In particular, a moving pin window is set up to encompass the maximum adjacency distance of a given pin for each iteration. All pins that come within the pin window are counted and a pin congestion level is assigned to the pin based on the number of pins adjacent to the given pin. Pin congestion level information is processed by a graphical user interface and graphically displayed to assist the integrated circuit designer in alleviating pin congestion problems.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

Figure 1:
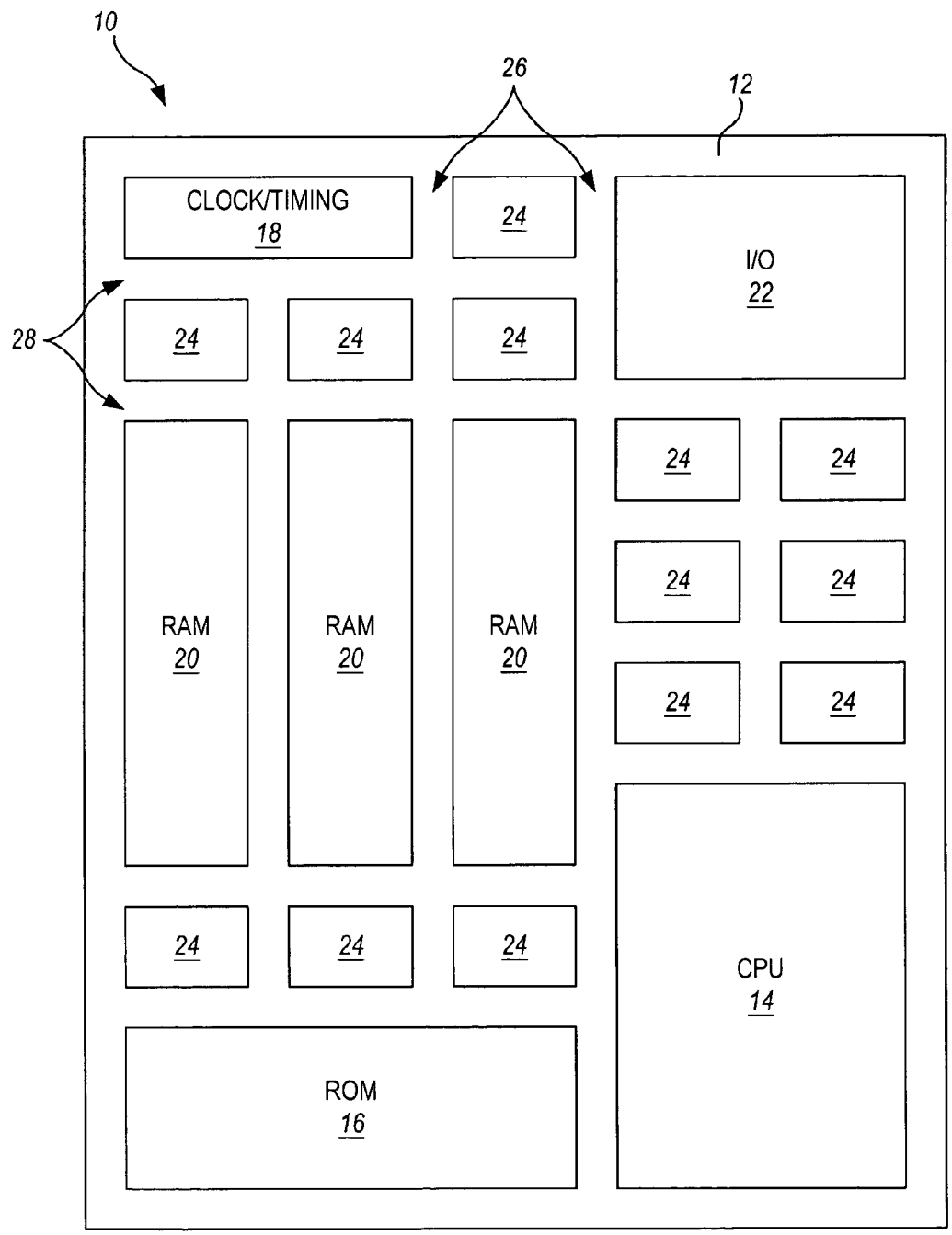
FIG. 1 is a floorplan view of an example integrated circuit.

Turning now to the drawings, an example integrated circuit chip is illustrated in FIG. 1 and generally designated by the reference numeral 10. The circuit 10 includes a semiconductor substrate 12 on which are formed a number of functional circuit blocks that can have different sizes and shapes. Some are relatively large, such as a central processing unit (CPU) 14, a read-only memory (ROM) 16, a clock/timing unit 18, one or more random access memories (RAM) 20 and an input/output (I/O) interface unit 22.

The integrated circuit 10 may further comprise a large number, which can be tens of thousands, hundreds of thousands or even millions or more of smaller blocks 24. Each block 24 may represent a single logic element, such as a gate, or several or many logic elements that are interconnected in a standardized manner to perform a specific function.

The smaller blocks 24 and the other functional blocks 14, 16, 18, 20 and 22 of the circuit 10 described above are interconnected or routed in accordance with the logical design of the circuit to provide the desired functionality. Although not visible in the drawing, the various blocks 14, 16, 18, 20, 22, and 24 of the circuit 10 are interconnected by electrically conductive lines or traces that are routed, for example, through vertical channels 26 and horizontal channels 28 that preferably run between the blocks.

The quality of the block placement depends on whether or not the nets in the netlist are routable and, if so, on the performance of the circuit in terms of how quickly signals are passed between blocks. In this regard, one of the goals of a good routing is to minimize the lengths of the wires or traces connecting the pins of the blocks.

The circuit 10 depicts one possible layout of the blocks 14, 16, 18, 20, 22, and 24 that make up the circuit 10. For any given circuit, there may be a large number of possible block layouts, especially when the shapes of the blocks and placement of block pins are allowed to vary. As described in the background section, block pin placement may make or break a physical design in terms of routability. Accordingly, prior to the routing phase, it would be desirable to get an idea, if not a definitive answer, of whether or not a proposed layout is routable, based on the proposed placement of the block pins in the various blocks of the circuit. One way to do this would be to collect and analyze statistics about routing congestion around the various pins of each block. In this regard, if one were to assume that routing congestion will likely result in areas of high pin concentration, one could look for areas of high pin concentration in each block and attempt to re-place some of the pins to alternative locations in the block in order to reduce the concentration of pins in the identified areas of high congestion risk. Thus, whereas there would still be no guarantee that a particular integrated circuit layout and block pin layout will result in a successful routing, there would at least be available a pre-routing check for pin congestion issues and an opportunity for correction or revision of pin placement prior to submission of the design to the router.

Figure 2:
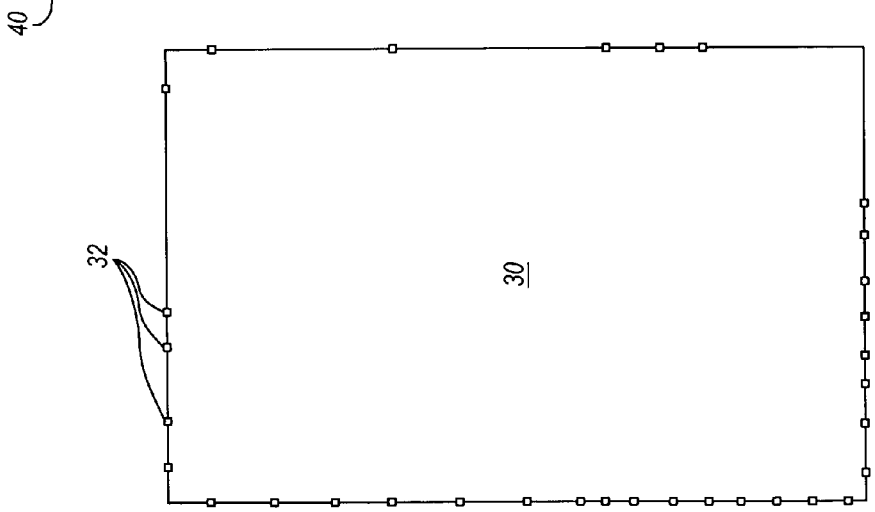
FIG. 2 is a floorplan view of an example block of an integrated circuit, which includes pins at pre-placed locations.

FIG. 2 illustrates an example block 30 with a plurality of pins 32 placed near the outer boundaries of the block 30.

Figure 3:
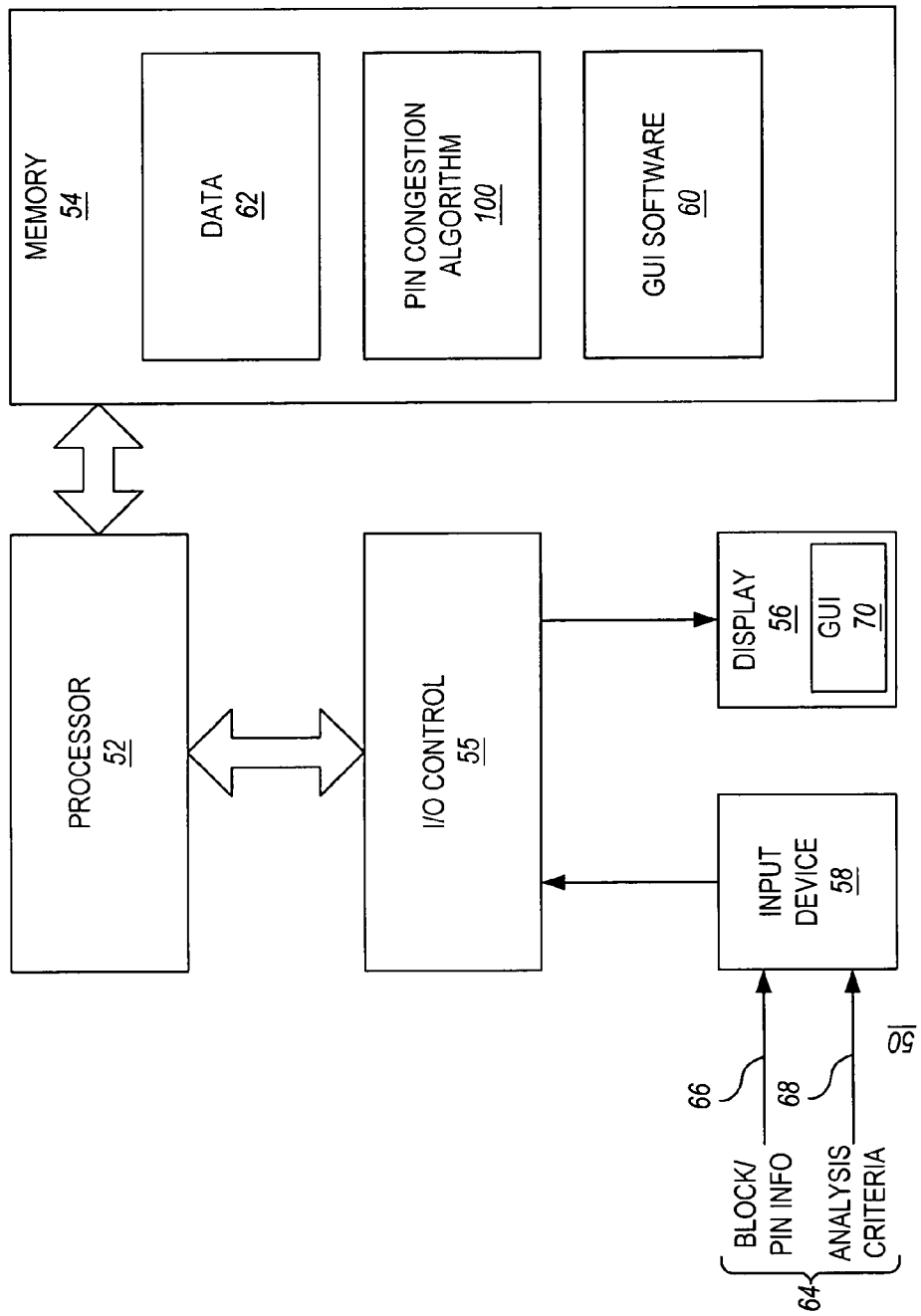
FIG. 3 is a block diagram of a computer system in which the pin congestion statistics collection and analysis algorithm and graphical user interface operates.

The present invention is a pin congestion statistics collection and analysis algorithm 100, shown in FIG. 3, that includes, or interfaces with, a graphical user interface for visually presenting pin congestion information to the integrated circuit designer. The pin congestion information of a proposed integrated circuit layout or block design may be used by the integrated circuit designer essentially as a pre-check of the design prior to submitting the proposed integrated circuit layout to a router. The pre-check of the design allows corrections or revisions to block pin placement for designs with high pin congestion risk prior to submitting the design to the lengthy routing process.

The pin congestion statistics collection and analysis algorithm 100 is preferably implemented in software running on a computer system 50, shown in FIG. 3, that includes a processor 52, memory 54 for storing the algorithm program instructions and data, input/output (I/O) control circuitry 55, a display 56, one or more input devices 58, and graphical user interface software 60, also preferably stored in the computer system memory 54. The computer system 50 allows user or other input via the one or more input devices 58. Input 64 may include a proposed integrated circuit layout including block information 66 for a single block of the design or for all blocks in the integrated circuit design. The block information includes block pin placement information. Input 64 may also include criteria 68 for collecting and analyzing pin congestion statistics for the design. The block information 66 and analysis criteria 68 are preferably stored as data 62 in the memory 54 of the computer system 50. The processor 52 executes the pin congestion statistics collection and analysis algorithm 100 by retrieving the algorithm program instructions and data from memory 54 and executing the instructions, operating on the data 62 as needed. The pin congestion statistics collection and analysis algorithm 100 processes the proposed integrated circuit layout design or block layout 66 and analyzes pin congestion statistics based on the specified criteria 68. Preferably, the criteria 68 may be selected by the user to allow greater versatility. Optional pin congestion criteria 68, discussed in more detail hereinafter, may include a maximum adjacency distance which defines how far a pin can be separated from another pin and still be considered adjacent, congestion ranges in which to group pins, metal layers of interest, and pins or pin match patterns of interest.

The pin congestion statistics collection and analysis algorithm 100 analyzes the layout design 66 in view of the selected criteria 68 and generates visual pin congestion statistics in a GUI 70 that may be viewed by the integrated circuit designer on the display 56 under the control of the processor 52, I/O control circuitry 55, and graphical user interface software 60 using well known graphical user interface rendering techniques. The visual pin congestion statistics presented in the GUI 70 on the display 56 preferably quickly impart to the integrated circuit designer areas of high congestion risk of the various pins of the integrated circuit layout design or block design, for example using different color codes as described more fully hereinafter.

Figure 4:
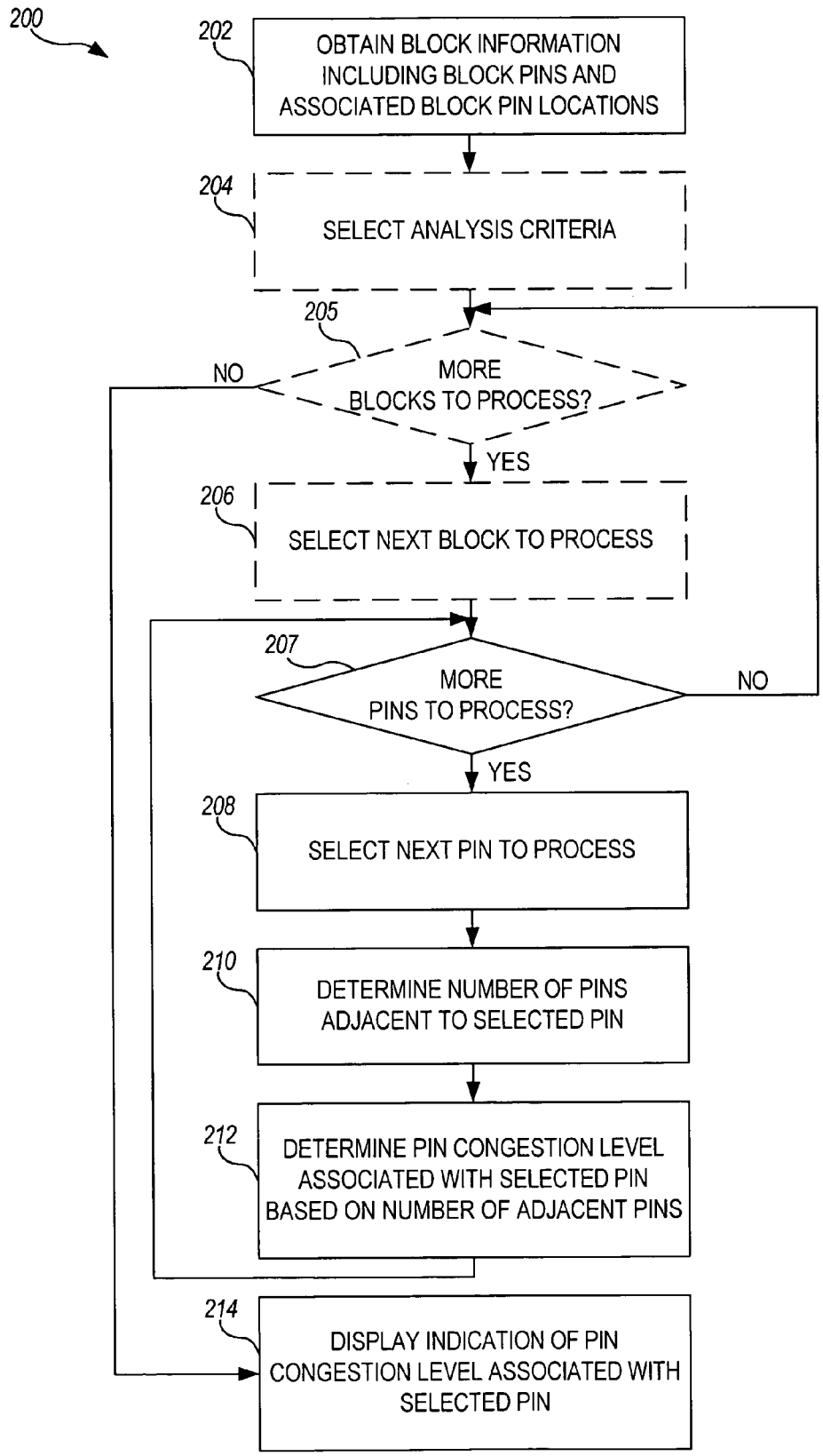
FIG. 4 is an operational flowchart of a pin congestion statistics collection and analysis algorithm in accordance with the invention.

FIG. 4 illustrates an exemplary method 200 that performs the preferred high-level steps of the pin congestion statistics collection and analysis algorithm 100. As illustrated, the pin congestion statistics collection and analysis algorithm 200 obtains block information including block pin identifiers and associated pin locations (step 202). Block information will generally include the integrated circuit core dimensions (if the entire integrated circuit layout is submitted to the algorithm 200), the dimensions and location of the blocks to be analyzed, the position of the pins (for example in relation to the block dimension) within each block to be analyzed, the metal layer of each pin, and the pin side with respect to block orientation. Block information is typically extractable from the floor-planning tool, for example floor-planning tool First Encounter Global Physical Synthesis (GPS), manufactured by Cadence Design Systems Inc, of San Jose, Calif.

The pin congestion statistics collection and analysis algorithm 200 optionally allows for selection of analysis criteria (step 204). For example, the algorithm 200 may allow specification of a maximum adjacency distance (which preferably specifies how far a pin can be separated from another pin according to a direct distance calculation (e.g., shortest distance without regard to legal routing channels) and still be considered adjacent). The algorithm 200 may also allow specification of the congestion ranges in which to group the pins (for example, pins with less than 20% congestion may be grouped into one category, pins with congestion between 20 and 39% may be grouped into a separate category, pins with congestion between 40 and 59% may be grouped into a separate category, pins with congestion between 60 and 79% may be grouped into a separate category, and pins with congestion between 80 and 100% may be grouped into a separate category). The algorithm 200 may also allow specification of certain metal layers which may be useful to constrain the analyzer to consider only the specified metal layers in the analysis of the set of pins. Similarly, the algorithm 200 may also allow specification of certain pins or pin-match patterns (one or more pins matching an identifier, a set of identifiers, a wildcard identifier, or a set of match conditions such as location information) to constrain the analyzer to consider only a set of pins or pin-match patterns of interest in the analysis. As stated above, the analysis criteria selection step 204 is optional, and each of the optional criteria will generally have default values assigned to them if criteria selection is either not offered by the particular implementation of the algorithm 200 or if bypassed by the user.

If more than one block is to be analyzed, the algorithm 200 will select a block from the pool of blocks to be analyzed (steps 205 and 206).

Within the selected block, the algorithm 200 selects a pin from the pool of pins to be analyzed (steps 207 and 208). The pool of pins to be analyzed are those pins within the selected block that meet the selected criteria, if any, or default criteria if no criteria is selected or if the criteria selection option is not available.

For the selected pin, the algorithm 200 determines the number of adjacent pins adjacent to the selected pin (step 210). A pin is considered adjacent to the selected pin if it is located within a predetermined maximum adjacency distance $D_M$ of the selected pin. The predetermined maximum adjacency distance $D_M$ can be a direct (i.e., "shortest") distance from one pin to any other pin without taking into account traversal of corners or legal routing channels, or an "around-the-corner" distance which includes distances to the nearest corner (or legal routing channel) and then over to the pin when the pin lies "around-the-corner" from a selected pin. As described previously, the maximum adjacency distance $D_M$ is preferably a user-definable analysis criteria that may be submitted to the algorithm 200 in step 204. The algorithm 200 can determine the distance between the selected pin and all other pins in the pool of pins to be analyzed based on the pin locations of each of the pins as obtained in step 201.

Based on the number of pins that are adjacent to the selected pin, the algorithm 200 then determines a pin congestion level associated with the selected pin (step 212).

The algorithm 200 then similarly processes the remaining pins in the pool of pins to be analyzed (i.e., repeats the steps 207 through 212), and then similarly processes the remaining blocks in the pool of blocks to be analyzed (i.e., repeats the steps 205 through 212).

The algorithm 200 then optionally graphically displays the pin congestion statistics on a display (step 214). Alternatively, the pin congestion statistics are made available to a separate graphical user interface, which reads the pin congestion statistics and then graphically displays the pin congestion statistics on a display.

Figure 5:
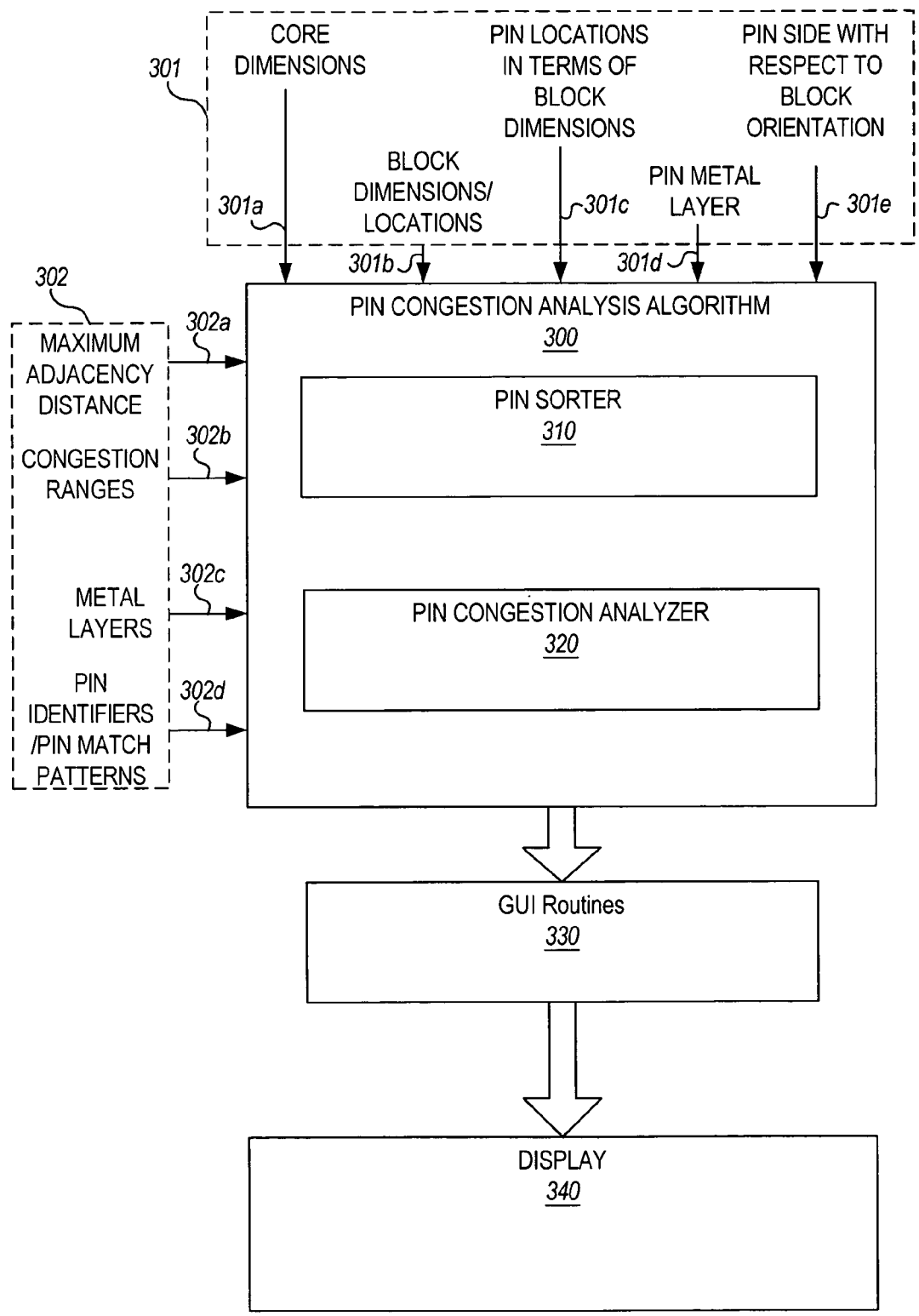
FIG. 5 is a block diagram illustrating the components of an exemplary embodiment of the pin congestion statistics collection and analysis algorithm in accordance with the invention.

Turning now to detailed discussion of a particular exemplary preferred embodiment of the invention, FIG. 5 illustrates, in block diagram form, the components of a pin congestion statistics collection and analysis algorithm 300. Appendix A contains an example implementation of the pin congestion statistics collection and analysis algorithm 300. The algorithm 300 is written in the well known TCL (Tool Command Language), which is the interface of choice for most EDA tools.

As illustrated in FIG. 5, the algorithm 300 receives, as input, block information 301 and analysis criteria 302. The block information 301 includes the core dimensions of the integrated circuit 301a, block locations and dimensions 301b, block pin locations 301c for each of the blocks relative to the respective block dimensions, block pin metal layers 301d for each of the pins, and pin side (i.e., which edge of the block the pin lies on (e.g., north, south, east, west)) with respect to block orientation 301e. The analysis criteria 302 includes a user-definable maximum adjacency distance 302a, user-definable congestion ranges 302b, user-constrainable metal layers 302c, and user-constrainable pin identifiers and/or pin match patterns 302d.

The pin congestion statistics collection and analysis algorithm 300 is implemented as a software algorithm characterized by a number of program instructions that resides in computer system instruction memory. The block information 301 and analysis criteria 302 may be passed as parameters to the algorithm 300, or may be actively retrieved by the algorithm 300 from computer system data memory. Furthermore, the pin congestion statistics collection and analysis algorithm 300 preferably includes default values for each of the analysis criteria 302 such that the integrated circuit designer is not required to define the criteria 302. In the illustrative embodiment, the pin congestion statistics collection and analysis algorithm 300 is implemented by a procedure 'showPinCongestion' listed in Appendix A.

In the illustrative embodiment, the preferred embodiment pin congestion statistics collection and analysis algorithm 300 assumes that all block pins are arranged in a pattern around the boundaries of a given block which, if connected in a clockwise or counter-clockwise manner, generally forms a pattern that imitates the shape of the block. For example, referring back to FIG. 2, block 30 has pins 32 placed at the outer edges of the block 30. If the pins were sequentially connected in a clockwise or counter-clockwise manner, the pins would generally form the rectangular shape of the block itself.

For maximum efficiency, the pin congestion statistics collection and analysis algorithm 300 includes a pin sorting routine 310 that takes advantage of this known pin placement protocol, by first sorting the pins. In the preferred embodiment, all pins of the current block are first sorted clockwise starting from the lower left corner of the block. This allows the pin list to be viewed as a circular list. In the illustrative embodiment, this is accomplished using the procedure 'sortPinsClockwise' listed in Appendix A, which uses the pin's location and pin side properties to determine its place in the block pin list to be analyzed. It will be obvious to those skilled in the art that the pin sorting routine 310 may alternatively sort the pins in the counter-clockwise direction.

When sorting the pins to generate a block pin list to be analyzed, pin sorting routing 310 preferably accesses and takes into account the analysis criteria 302. In this regard, if a pin does not meet the analysis criteria 302, the pin is preferably omitted from the block pin list to be analyzed. Thus, for example, if the analysis criteria specifies metal layers 1 and 2 but not 3, no pins on metal layer 3 will be included in the block pin list to be analyzed.

The pin congestion statistics collection and analysis algorithm 300 also preferably includes a pin congestion analyzer routine 320. Once all the pins of a given block are sorted, the pin sorter routine 310 passes the block pin list to be analyzed to the pin congestion analyzer routine 320, which iterates over each block pin in the list to analyze congestion statistics. In the illustrative embodiment, this is accomplished using the procedure 'analyzePinCongestion' listed in Appendix A.

Figure 6C:
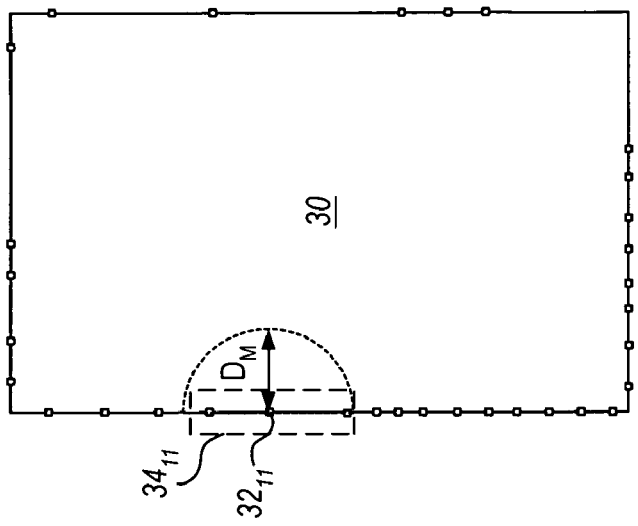
FIG. 6C is a graphical representation of the block of FIG. 2, indicating the location of a pin window around a eleventh block pin.
Figure 6B:
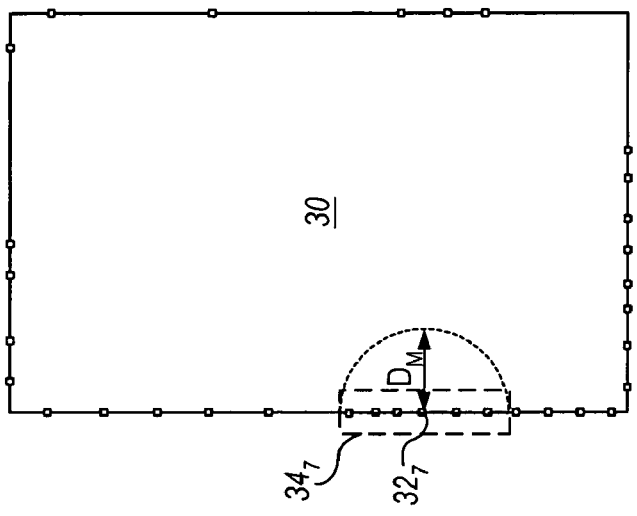
FIG. 6B is a graphical representation of the block of FIG. 2, indicating the location of a pin window around a seventh block pin.
Figure 6A:
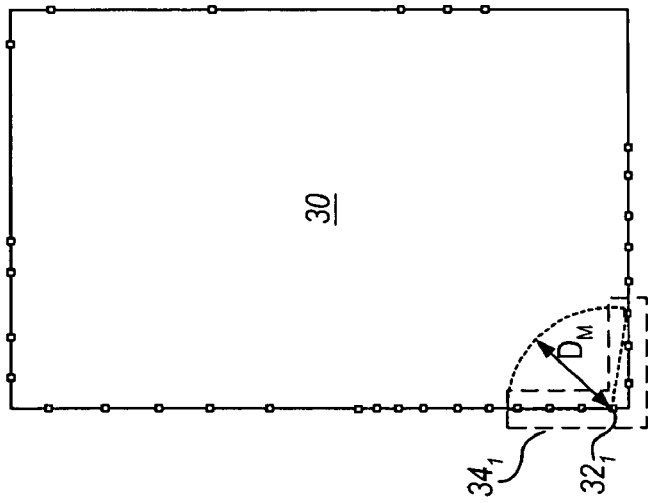
FIG. 6A is a graphical representation of the block of FIG. 2, indicating the location of a pin window around a first block pin.

The pin congestion analyzer routine 320 determines pin congestion by finding out how many pins are within a direct maximum adjacency distance $D_M$ from each pin. To accomplish this, in the illustrative embodiment, the analyzePinCongestion procedure sets up a "pin-window" that lists all the pins within the specified direct maximum adjacency distance $D_M$ from the current pin. The analyzePinCongestion procedure iterates over each pin, removing pins from the pin-window that are further than the direct maximum adjacency distance DM from the current pin and adding to the pin-window pins that are come within the specified maximum adjacency distance. Because the sorted pin list describes a circumferential pattern, the pin list is considered circular. Accordingly, a pin-window for a pin at or near the beginning of the pin list must be pre-loaded with any pins within the direct maximum adjacency distance $D_M$ that are positioned behind (i.e., earlier in the block circumference) the current pin's position. Similarly, a pin-window for a pin at or near the end of the pin list must be post-loaded with any pins within the direct maximum adjacency distance $D_M$ that are positioned after (i.e., further around the block circumference) the current pin's position. The sorted circular pin list is entered at the beginning of the procedure, which corresponds to the first pin encountered traversing clockwise starting at the lower-left corner of the block. FIGS. 6A, 6B and 6C graphically show the concept of the pin-window with pin-window $34_{11}$ pin-window $34_7$ and pin-window $34_{11}$ as it would look for pin $32_1$, pin $32_7$ and pin $32_{11}$, respectively, of the block 30 of FIG. 2. The pin congestion statistics for each pin are preferably stored by the pin congestion statistics collection and analysis algorithm 300, which are then made available to a graphical user interface routine 330 for graphical display on a user's display. A preferred method for storing pin congestion statistics is in the form of congestion range histograms. To this end, as the congestion level of each pin is determined, it is added to a bin containing pins in a similar congestion range. In the illustrative embodiment, the GUI is integrated into the analyzePinCongestion procedure of Appendix A.

Various approaches exist for graphically displaying pin congestion statistics on a display. One approach is to simply list the pins and their associated pin congestion level. However, this approach can make it tedious for the integrated circuit designer to determine how to quickly replace pins with high congestion risk based on the pins around them.

A better approach is to color-code the pins according to congestion level. In this approach, the block and its pins (i.e., those that meet the analysis criteria) can be rendered on the display, where each pin is rendered in a color that uniquely corresponds to the pin's associated pin congestion level. This approach, while ultimately intuitive, may require significant performance resources, especially in integrated circuit designs with a high net count, or when the GUI provides zoom and pan operations.

Figure 7:
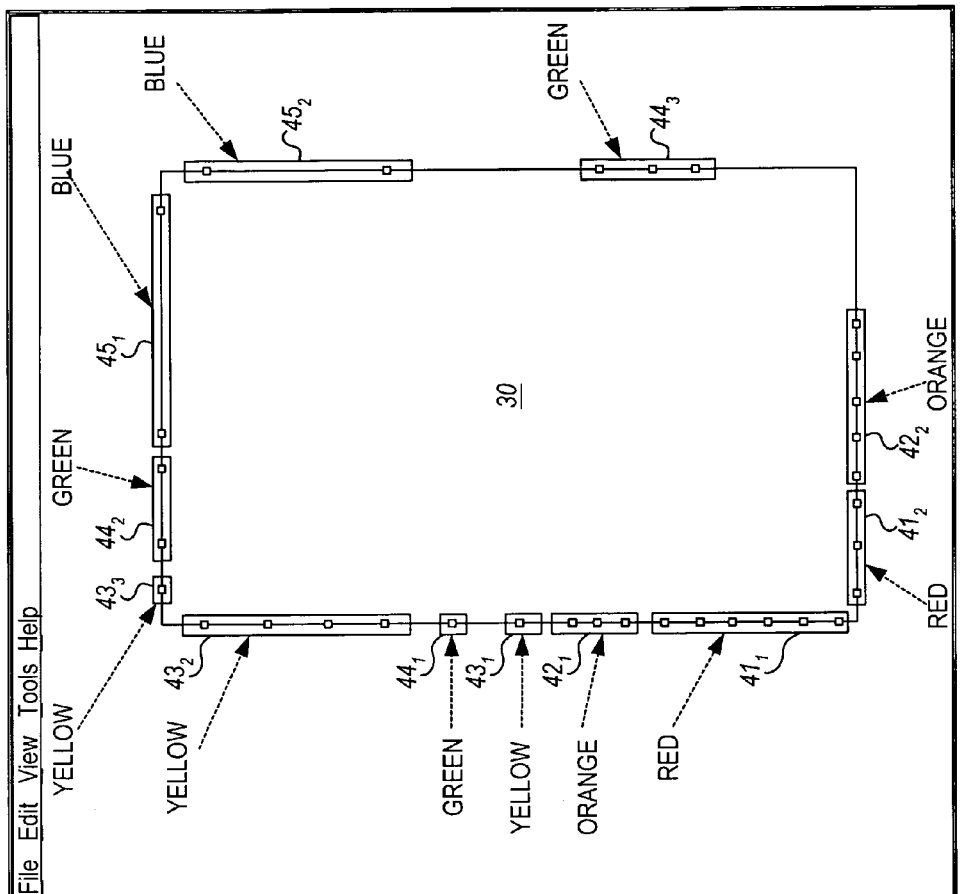
FIG. 7 is a GUI illustrating a graphical image of the block of FIG. 2, indicating congestion risk levels by drawing different colored rectangles around groups of pins characterized by the same congestion levels.

Yet another approach, which is the approach taken in the illustrative embodiment of Appendix A, groups pins that are adjacent to each other and have the same pin congestion range. A rectangle rendered in the unique color corresponding to the particular congestion range of the pin group is drawn around each pin group, and the pins remain rendered in a default color so as to eliminate the need for re-rendering. Because of the reduced number of rectangles having to be drawn and managed on the GUI, this approach improves performance a great deal. FIG. 7 illustrates a graphical user interface (GUI) 40 that utilizes this approach with a graphical representation of the block 30 of FIG. 2, where congestion risks are by drawing different colored rectangles (red 41, orange 42, yellow 43, green 44, and blue 45 in order of decreasing risk) around the pins depending on how many pins are within the specified distance from each pin. In the illustrative embodiment, pins with a congestion range of less than 20% are enclosed in a blue rectangle, pins with a congestion between 20 and 39% are enclosed in a green rectangle, pins with a congestion between 40 and 59% are enclosed in a yellow rectangle, pins with a congestion between 60 and 79% are enclosed in a orange rectangle, and pins with a congestion between 80 and 100% are enclosed in a red rectangle. The integrated circuit designer can then easily see that the lower-left corner of this block may suffer from congestion issues and quickly pin-point which pins and where these pins may be re-placed in the block to alleviate the pin congestion issues prior to submitting the integrated circuit design to a router for the routing phase.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

APPENDIX A

Basic Data Reporting Procedures

The following procedures are not detailed but must be defined and explained so as to describe the functionality of the main algorithms.
    coreBlocks - Returns all the blocks in the core.
    coreLayers - Returns the legal pin layers of the core.
    coreWidth - The width of the core.
    coreHeight - The height of the core.
    blockLocation - The location of the block returned as a list of an X and Y location corresponding to the position of the block with respect to the overall chip dimensions. Example: 'blockLocation $block' would return {8.8 260.8}.
    blockWidth - The width of the block.
    blockHeight - The height of the block.
    blockPins - Returns all the pins of the specified block.
    pinLocation - The location of the pin returned as a list of an X and Y location corresponding to the position of the pin with respect to the block. Example: 'pinLocation $pin' would return {0.231 0.482}.
    pinLayer - The layer the pin is on. Example 'pinLayer layer2Pin' would return 2.
    pinSide - The side the pin is on with respect to the block. Example 'pinSide westSidePin' would return west.
    drawRect - Draws a rectangle on the GUI at the specified coordinates with the specified color. Example 'drawRect -color blue 8.8 8.8 17.6 17.6' would draw a blue rectangle at the coordinates specified.
    parseArguments - Parses the arguments passed into the procedure and establishes an array based on these parsed arguments.
    max - Returns the maximum of two numbers. Example: 'max 21 42' would return 42.
    min - Returns the minimum of two numbers. Example: 'min 21 42' would return 21.

Pin Congestion Procedures

The procedures below define the necessary procedures to be able to analyze pin congestion risks.

```
################################################################
# Title: showPinCongestion
# Description: The main procedure that is used to parse user arguments
#  and gather required information.
# Arguments:
#   -pins pins: Only analyze the listed pins (or pin-match patterns) for
#               congestion risks.
#   -blocks blocks : Only analyze the listed blocks' pins for congestion
#               risks.
#   -pin_range range: The distance from each pin in which to consider an
#               adjacent pin to be close enough to be counted in the
#               congestion count.
#   -layers layers : The layers to consider. Only pins on these layers will
#               be considered when analyzing congestion.
#   -ranges ranges : The ranges to use when determining what limits to
#               map to different colored rectangles. This argument is
#               optional, if it is not defined, the ranges will be set
#               up such that 80% of the largest and up is colored red,
#               60%-80% is orange, and so on.
################################################################
proc showPinCongestion {args} {
    global pinCongestionArray
    parseArguments $args pinCongestionArray
    ### Determine what layers to check for pin congestion.
    if {[info exists pinCongestionArray(-layers)]} {
        ### Only analyze pins on the specified layers.
        foreach layer $pinCongestionArray(-layers) {
            set pin_layer($layer) 1
        }
```

APPENDIX A-continued

```
    } else {
        ### Analyze pins on all layers.
        foreach layer [coreLayers] {
            set pin_layer($layer) 1
        }
    }
    ### Determine which blocks to check for pin congestion.
    if {[info exists pinCongestionArray(-blocks)]} {
        ### Analyze only the specified blocks.
        foreach block $pinCongestionArray(-blocks) {
            set blocks($block) 1
        }
    } else {
        ### Analyze all blocks.
        foreach block [coreBlocks] {
            set blocks($block) 1
        }
    }
    ### Put together a list of pins to analyze based on the user's options.
    foreach block [array names blocks] {
        ### Initialize empty-set pin list.
        set pinList { }
        foreach pin [blockPins $block] {
            ### First check that the pin is on a desired layer.
            if {! [info exists pin_layer([pinLayer $pin])] } {
                ### Not interested in this layer so do not analyze this pin.
                continue
            }
            ### Now check if this pin matches the pins (or pin-match
            ### patterns) specified in the options.
            if {[info exists pinCongestionArray(-pins)]} {
                foreach pattern $pinCongestionArray(-pins) {
                    if {[string match $pattern $pin] != 0} {
                        ### This pin matches the desired pins.
                        lappend pinList $pin
                        break
                    }
                }
            } else {
                ### All pins are desired.
                lappend pinList $pin
            }
        }
        ### Now that there is a list of desired pins to analyze, they need
        ### to be sorted clockwise to save on iteration time.
        set pinList [lsort -command sortPinsClockwise $pinList]
        ### And analyze the sorted pin list for pin congestion risks.
        analyzePinCongestion $block $pinList
    }
}
################################################################
# Title: sortPinsClockwise
# Description: When used with the lsort command, it will sort the list of
#  pins clockwise starting at the lower-left (southwest) corner of the block.
# Arguments:
#   pin1       : The first pin in the comparison.
#   pin2       : The second pin in the comparison.
################################################################
proc sortPinsClockwise {pin1 pin2} {
    ### First, attain the locations and sides.
    set loc1 [pinLocation $pin1]
    set side1 [pinSide $pin1]
    set loc2 [pinLocation $pin2]
    set side2 [pinSide $pin2]
    ### The K factor will spread out the sides of the block so that west
    ### is less
    ### than north, north is less than east, etc.
    set K [max [coreWidth][coreHeight]]
    set Kwest [expr 1 * $K]
    set Knorth [expr 2 * $K]
    set Keast [expr 3 * $K]
    set Ksouth [expr 4 * $K]
    upvar 0 K$side1 side1K
    upvar 0 K$side2 side2K
    if {$side1 == "west" || $side1 == "east"} {
        ### We are interested in the Y value if east or west.
        set id1 [lindex $loc1 1]
    } else {
        ### We are interested in the X value if north or south.
```

APPENDIX A-continued

```
        set id1 [Iindex $loc1 0]
    }
    if {$side1 == "east" || $side1 == "south"} {
        ### Pins on the east side need to be sorted from top to bottom.
        ### Pins on the south side need to be sorted from right to left.
        set cmp1 [expr {$side1K - $id1}]
    } else {
        ### Pins on the west side need to be sorted from bottom to top.
        ### Pins on the north side need to be sorted from left to right.
        set cmp1 [expr{$side1K + $id1}]
    }
    if {$side2 == "west" || $side2 == "east"} {
        ### We are interested in the Y value if east or west.
        set id2 [Iindex $loc2 1]
    } else {
        ### We are interested in the X value if north or south.
        set id2 [Iindex $loc2 0]
    }
    if {$side2 == "east" || $side2 == "south"} {
        ### Pins on the east side need to be sorted from top to bottom.
        ### Pins on the south side need to be sorted from right to left.
        set cmp2 [expr {$side2K - $id2}]
    } else {
        ### Pins on the west side need to be sorted from bottom to top.
        ### Pins on the north side need to be sorted from left to right.
        set cmp2 [expr {$side2K + $id2}]
    }
    return [expr {$cmp1 - $cmp2}]
}
##############################################################
# Title: analyzePinCongestion
# Description: Will loop though the list of sorted (clockwise) pins and
#   analyze pin congestion using the global pinCongestionArray variable.
#   The algorithm will create a "pin window" that consists of a sorted list
#   of the pins that are within a certain distance from the current pin. As
#   each new pin is analyzed, this "pin window" is traversed and pins that
#   are no longer within a given distance from this pin are removed and
#   new pins that are now within the given distance are added. The size of
#   the window is then stored and used later to determine pin congestion.
# Arguments:
#   block    : The parent block.
#   pinList  : The sorted list of pins to analyze.
##############################################################
proc analyzePinCongestion {block pinList} {
    global pinCongestionArray
    ### First, store the X and Y location of the block as all the pin
    ### coordinates are relative to the parent block.
    set blockX [Iindex [blockLocation $block] 0]
    set blockY [Iindex [blockLocation $block] 1]
    ### Also store some variables that will be used later.
    set startPin [Iindex $pinList 0]
    set pinListLength [Ilength $pinList]
    set pinWindow $startPin
    set largest 0
    ### Do some reporting on the statistics as they are gathered
    ### and print to stdout.
    set string "Pin Congestion Histogram for '$block'"
    puts "$string"
    puts "[string repeat - [string length $string]]"
    puts "Number of pins processed: $pinListLength"
    ### Because the iteration has to start somewhere, the
    ### "pin window" must be pre-loaded with pins from the
    ### end of the sorted pin list. This can be done by
    ### iterating through the sorted pin list in reverse.
    ### The loop below will only load the back-end of the pin
    ### window and let the regular pin-list loop add to the front-
    ### end.
    for {set i [expr $pinListLength - 1]} {$i > 0} {incr i -1} {
        set nextPin [Iindex $pinList $i]
        set distance [pinSeparation Distance $startPin $nextPin]
        if {$distance <= $pinCongestionArray(pin_range)} {
            ### Add to the front of the "pin window" to maintain the sorted
            list.
            set pinWindow [Iinsert $pinWindow 0 $nextPin]
        } else {
            ### Because this is a sorted list, if any pin is determined to be
            ### too far from the start pin, there is no need to analyze the
            rest
            ### of the list (all the rest of the pins are also too far away).
            break
        }
    }
    ### To allow for pins at the end of the list to check adjacency to pins
    ### at the start of the list, the pinList must be extended. This will be
    ### done once the front end of the start pin's "pin window" has been
    ### identified.
    set ext_pinList $pinList
    set lastIdx 0
    set extension ""
    ### First, check if all pins are within a given distance of each other.
    if {[Ilength $pinWindow] == $pinListLength} {
        ### All selected pins are within the specified distance of each
        other.
        ### Loop through them to store the appropriate statistics.
        foreach pin $pinList {
            set statistics($pin) $pinListLength
        }
        ### Store the largest number of adjacent pins for the histogram
ranges.
        set largest $pinListLength
    } else {
        ### Loop through each pin and establish the "pin window."
        for {set i 0} {$i <$pinListLength} {incr i} {
            set currentPin [Iindex $pinList $i]
            set pos -1
            ### First, remove from the back-end of the "pin window."
            for {set j 0} {$j < [Ilength $pinWindow]} {incr j} {
                set windowPin [Iindex $pinWindow $j]
                set distance [pinSeparation Distance $currentPin
                $windowPin]
                if {$distance > $pinCongestionArray(pin_range)} {
                    ### This pin will need to be removed from the "pin
                    ### window." This will be done by storing the indices
                    ### of the list that need to be removed.
                    set pos $j
                } else {
                    ### Because this is a sorted list, there is no more work to
                    do.
                    break
                }
            }
            if {$pos != -1} {
                ### There are pins that need to be removed from the "pin
                window."
                set pinWindow [Ireplace $pinWindow 0 $pos]
            }
            ### Next, add to the front-end of the "pin window."
            for {set j [expr $lastIdx + 1]} {$j < [Ilength $ext_pinList]}
            {incr j} {
                set nextPin [Iindex $ext_pinList $j]
                set distance [pinSeparationDistance $currentPin $nextPin]
                if {$distance <= $pinCongestionArray(pin_range)} {
                    ### Add this pin to the "pin window."
                    lappend pinWindow $nextPin
                    ### Store the last index that was searched for faster list
                    ### traversal.
                    set lastIdx $j
                    if {$i == 0} {
                        ### This means that this is the first pin so we need
                        ### to extend the "extended_pinList" so that pins at
                        ### the end of the list can consider adjacent pins at the
                        ### start of the list.
                        lappend extension $nextPin
                    }
                } else {
                    ### A sorted list means that we need not traverse any
                    further.
                    break
                }
            }
            ### Store the pin statistics.
            set statistics($currentPin) [Ilength $pinWindow]
            ### Store the largest number of adjacent pins for the histogram
ranges.
            set largest [max $largest [Ilength $pinWindow]]
            ### If this is the first pin, extend the pin list with the first pin's
            ### front-end of the "pin window."
            if {$i == 0} {
```

APPENDIX A-continued

```
            set ext_pinList [concat $pinList $extension]
        }
    }
}
Now that all of the pin statistics have been stored, the rectangles
can be drawn on the GUI. The following colors are used to show
the different severities of pin congestion risks:
red : Most risk.
orange: Upper-middle risk.
yellow: Middle risk.
green : Lower-middle risk.
blue : Least risk.
Setup the ranges.
if {! [info exists pinCongestionArray(-ranges)]} {
    ### The ranges are based on the largest pin adjacency count.
    set range(red) [expr int(0.8 * $largest)]
    set range(orange) [expr int(0.6 * $largest)]
    set range(yellow) [expr int(0.4 * $largest)]
    set range(green) [expr int(0.2 * $largest)]
    set range(blue) 0
} else{
    ### It is assumed that the argument parser checked that the
    ### variable pinCongestionArray(-ranges) is a 5 integer list.
    set ranges [lsort -real -decreasing $pinCongestionArray(-ranges)]
    set range(red) [lindex $ranges 0]
    set range(orange) [lindex $ranges 1]
    set range(yellow) [lindex $ranges 2]
    set range(green) [lindex $ranges 3]
    set range(blue) [lindex $ranges 4]
}
puts "Largest number of adjacent pins: $largest"
Keep additional statistics on how many of each range there are.
set red 0
set orange 0
set yellow 0
set green 0
set blue 0
set ignored 0
set rectWidth 2.2
To save on GUI resources, each different colored rectangle
will encompass as many pins in the same range as possible. Also,
corners
of the block (going from west to north) will also constitute a
break in rectangles.
for {set i 0} {$i <[llength $pinList]} {incr i} {
    set currentPin [lindex $pinList $i]
    set numPins $statistics($currentPin)
    set location [pinLocation $currentPin]
    set currentX [expr {[lindex $location 0] + $blockX}]
    set currentY [expr {[lindex $location 1] + $blockY}]
    ### Check number of pins against ranges.
    if {$numPins >= $range(red)} {
        set color red
    } elseif {$numPins >= $range(orange)} {
        set color orange
    } elseif {$numPins >= $range(yellow)} {
        set color yellow
    } elseif {$num Pins >= $range(green)} {
        set color green
    } elseif {$numPins >= $range(blue)} {
        set color blue
    } else {
        ### The specified ranges on the command line are too high
        ### for this particular pin so it is ignored.
        incr ignore
        continue
    }
    ### Store the first pin's information as it is required to start
    ### a new rectangle since it is the first pin on the southwest
    ### corner.
    if {$i == 0} {
        set startX $currentX
        set startY $currentY
    }
    if {([info exists prevColor] && $prevColor != $color) || \
        ([info exists prevSide] && [pinSide $currentPin] !=
        $prevSide)} {
        ### If the color changes or the side changes, a rectangle
        ### needs to be drawn.
        set maxX [max $startX $prevX]
        set minX [min $startX $prevX]
        set maxY [max $startY $prevY]
        set minY [min $startY $prevY]
        if {$prevSide == "south" || $prevSide == "north"} {
            if {$maxX == $minX} {
                ### The rectangle must have a minimum width.
                set minX [expr $minX - $rectWidth]
                set maxX [expr $maxX + $rectWidth]
            }
            set rectangle [list $minX [expr $minY - $rectWidth] \
                $maxX [expr $maxY + $rectWidth]]
        } else {
            if {$maxY == $minY} {
                ### The rectangle must have a minimum height.
                set minY [expr $minY - $rectWidth]
                set maxY [expr $maxY + $rectWidth]
            }
            set rectangle [list [expr $minX - $rectWidth] $minY \
                [expr $maxX + $rectWidth] $maxY]
        }
        ### Draw the rectangle on the GUI.
        drawRect $rectangle -color $prevColor
        ### The current pin starts a new rectangle.
        set startX $currentX
        set startY $currentY
    }
    ### Keep track of each range's number of pins.
    incr $color
    set prevSide [pinSide $currentPin]
    set prevColor $color
    set prevX $currentX
    set prevY $currentY
}
Draw the last rectangle.
set maxX [max $startX $prevX]
set minX [min $startX $prevX]
set maxY [max $startY $prevY]
set minY [min $startY $prevY]
if {$prevSide == "south" || $prevSide == "north"} {
    if {$maxX == $minX} {
        ### The rectangle must have a minimum width.
        set minX [expr $minX - $rectWidth]
        set maxX [expr $maxX + $rectWidth]
    }
    set rectangle [list $minX [expr $minY - $rectWidth] \
        $maxX [expr $maxY + $rectWidth]]
}else {
    if {$maxY == $minY} {
        ### The rectangle must have a minimum height.
        set minY [expr $minY - $rectWidth]
        set maxY [expr $maxY + $rectWidth]
    }
    set rectangle [list [expr $minX - $rectWidth] $minY \
        [expr $maxX + $rectWidth] $maxY]
}
Draw the rectangle on the GUI.
drawRect $rectangle -color $prevColor
Finish up by printing out range histogram statistics.
set last $largest
set fw [string length $largest]
foreach color [list red orange yellow green blue] {
    upvar 0 $color value
    set rng $range($color)
    puts "[format {%*s - %*s: %*s} $fw $rng $fw $last $fw $value]
    ($color)"
    set last $rng
}
if {$last != 0 && $ignore > 0} {
    set rng 0
    puts "[format {%*s - %*s: %*s} $fw $rng $fw $last $fw
    $ignore]
    (ignored)"
}
}
###############################################################
# Title: pinSeparationDistance
# Description: Determines the direct distance between two pins. This
#   procedure uses Pythagorean's theorem.
```

APPENDIX A-continued

```
# Arguments:
#   pin1        : The first pin in the comparison.
#   pin2        : The second pin in the comparison.
##################################################################
    proc pinSeparationDistance {pin1 pin2} {
        ### First, attain the locations and setup 'a' and 'b' variables
        ### for Pythagorean's a2 + b2 = c2 equation.
        set loc1 [pinLocation $pin1]
        set loc2 [pinLocation $pin2]
        set a [expr {[lindex $loc1 0] - [lindex $loc2 0]}]
        set b [expr {[lindex $loc1 1] - [lindex $loc2 1]}]
        ### And rearrange the equation and return the separation distance.
        return [expr {sqrt(pow($a,2)+pow($b,2))}]
    }
```

What is claimed is:

1. A method for displaying pin placement congestion in an integrated circuit design, said method comprising the steps of:
    obtaining a plurality of respective pin locations associated with a respective plurality of pins;
    selecting a pin from said plurality of pins;
    determining a number of adjacent pins adjacent to said selected pin, said number of adjacent pins comprising all of said plurality of pins within a predetermined maximum adjacency distance of said selected pin;
    calculating a pin congestion level associated with said selected pin based on said number of adjacent pins;
    wherein said obtaining step through said calculating step are performed prior to routing said integrated circuit design;
    and displaying in a graphical user interface an indication of said congestion level of said selected pin.

2. A method in accordance with claim 1, wherein;
    said predetermined maximum adjacency distance comprises a direct distance.

3. A method in accordance with claim 1, wherein said displaying step comprises:
    demarcating said selected pin using a unique color that corresponds to said selected pin.

4. A method in accordance with claim 1, wherein said displaying step comprises:
    grouping adjacent pins of a similar congestion level to generate one or more groups of adjacent pins; and
    for each group of adjacent pins, graphically demarcating said respective group of adjacent pins using a unique color corresponding to said congestion level corresponding to said group of adjacent pins.

5. A method in accordance with claim 1, further comprising the steps of:
    repeating said selecting step through said calculating step for each of said plurality of pins.

6. A method in accordance with claim 5, wherein;
    said predetermined maximum adjacency distance comprises a direct distance.

7. A method in accordance with claim 5, comprising:
    displaying in a graphical user interface an indication of said congestion level of said selected pin.

8. A method in accordance with claim 7, wherein said displaying step comprises:
    graphically demaroating said selected pin using a unique color that corresponds to said selected pin.

9. A method in accordance with claim 7, wherein said displaying step comprises;
    grouping adjacent pins of a similar congestion level to generate one or more groups of adjacent pins; and
    for each group of adjacent pins, graphically demarcating said respective group of adjacent pins using a unique color corresponding to said congestion level corresponding to said group of adjacent pins.

10. A method in accordance with claim 5, further comprising the steps of:
    repeating said selecting step through said first repeating step for each of a plurality of functional blocks of said integrated circuit design.

11. A method in accordance with claim 10, wherein:
    said predetermined maximum adjacency distance comprises a direct distance.

12. A method in accordance with claim 10, comprising;
    displaying in a graphical user interface an indication of said congestion level of said selected pin.

13. A method in accordance with claim 12, wherein said displaying step comprises:
    graphically demarcating said selected pin using a unique color that corresponds to said selected pin.

14. A method in accordance with claim 12, wherein said displaying step comprises;
    grouping adjacent pins of a similar congestion level to generate one or more groups of adjacent pins; and
    for each group of adjacent pins, graphically demarcating said respective group of adjacent pins using a unique color corresponding to said congestion level corresponding to said group of adjacent pins.

15. A computer readable storage medium tangibly embodying program instructions implementing a method for displaying pin placement congestion in an integrated circuit design, the method comprising the steps of:
    obtaining a plurality of respective pin locations associated with a respective plurality of pins;
    selecting a pin from said plurality of pins;
    determining a number of adjacent pins adjacent to said selected pin, said number of adjacent pins comprising all of said plurality of pins within a predetermined maximum adjacency distance of said selected pin;
    calculating a pin congestion level associated with said selected pin based on said number of adjacent pins;
    wherein said obtaining step through said calculating step are performed prior to routing said integrated circuit design;
    and displaying in a graphical user interface an indication of said congestion level of said selected pin.

16. A computer readable storage medium in accordance with claim 15, wherein:
    said predetermined maximum adjacency distance comprises a direct distance.

17. A computer readable storage medium in accordance with claim 15, wherein said displaying step comprises:
    demarcating said selected pin using a unique color that corresponds to said selected pin.

18. A computer readable storage medium in accordance with claim 15, wherein said displaying step comprises:
    grouping adjacent pins of a similar congestion level to generate one or more groups of adjacent pins; and
    for each group of adjacent pins, graphically demarcating said respective group of adjacent pins using a unique color corresponding to said congestion level corresponding to said group of adjacent pins.

19. A computer readable storaae medium in accordance with claim 15, the method further comprising the steps of:
    repeating said selecting step through said calculating step for each of said plurality of pins.

20. A computer readable storauc medium in accordance with claim 19, wherein:

said predetermined maximum adjacency distance comprises a direct distance.

21. A computer readable storage medium in accordance with claim 19, the method comprising:
displaying in a graphical user interface an indication of said congestion level of said selected pin.

22. A computer readable storage medium in accordance with claim 21, wherein said displaying step comprises:
graphically demarcating said selected pin using a unique color that corresponds to said selected pin.

23. A computer readable storage medium in accordance with claim 21, wherein said displaying step comprises:
grouping adjacent pins of a similar congestion level to generate one or more groups of adjacent pins; and
for each group of adjacent pins, graphically demarcating said respective group of adjacent pins using a unique color corresponding to said congestion level corresponding to said group of adjacent pins.

24. A computer readable storage medium in accordance with claim 19, the method further comprising the steps of:
repeating said selecting step through said first repeating step for each of a plurality of functional blocks of said integrated circuit design.

25. A computer readable storage medium in accordance with claim 24, wherein:
said predetermined maximum adjacency distance comprises a direct distance.

26. A computer readable storage medium in accordance with claim 24, the method comprising:
displaying in a graphical user interface an indication of said congestion level of said selected pin.

27. A computer readable storage medium in accordance with claim 26, wherein said displaying step comprises:
graphically demarcating said selected pin using a unique color that corresponds to said selected pin.

28. A computer readable storage medium in accordance with claim 26, wherein said displaying step comprises:
grouping adjacent pins of a similar congestion level to generate one or more groups of adjacent pins; and
for each group of adjacent pins, graphically demarcating said respective group of adjacent pins using a unique color corresponding to said congestion level corresponding to said group of adjacent pins.

\* \* \* \* \*

UNITED STATES PATENT AND TRADEMARK OFFICE
CERTIFICATE OF CORRECTION

PATENT NO. : 7,275,230 B2 Page 1 of 1
APPLICATION NO. : 10/866457
DATED : September 25, 2007
INVENTOR(S) : Jason Gentry It is certified that error appears in the above-identified patent and that said Letters Patent is hereby corrected as shown below:

Col. 15 Line 35 In Claim 2, after "wherein" delete ";" and insert -- : --, therefor.

Col. 15 Line 54 In Claim 6, after "wherein" delete ";" and insert -- : --, therefor.

Col. 15 Line 62 In Claim 8, delete "demaroating" and insert -- demarcating --, therefor.

Col. 15 Line 65 In Claim 9, after "comprises" delete ";" and insert -- : --, therefor.

Col. 16 Line 13 In Claim 12, after "comprising" delete ";" and insert -- : --, therefor.

Col. 16 Line 21 In Claim 14, after "comprises" delete ";" and insert -- : --, therefor.

Col. 16 Line 62 In Claim 19, delete "storaae" and insert -- storage --, therefor.

Col. 16 Line 66 In Claim 20, delete "storauc" and insert -- storage --, therefor.

Signed and Sealed this

Twenty-fourth Day of February, 2009

JOHN DOLL
*Acting Director of the United States Patent and Trademark Office*